United States Patent
Chapman

(10) Patent No.: US 6,268,742 B1
(45) Date of Patent: Jul. 31, 2001

(54) TAP AND MATCHED FILTER ARRANGEMENT

(75) Inventor: Kenneth D. Chapman, Surrey (GB)

(73) Assignee: Xilinx, Inc., San Jose, CA (US)

(*) Notice: Subject to any disclaimer, the term of this patent is extended or adjusted under 35 U.S.C. 154(b) by 0 days.

(21) Appl. No.: 09/482,153

(22) Filed: Jan. 12, 2000

(51) Int. Cl.[7] .................................. H03L 19/177
(52) U.S. Cl. ............................. 326/39; 375/207
(58) Field of Search ................. 326/38–41; 375/207

(56) References Cited

U.S. PATENT DOCUMENTS

| | | | |
|---|---|---|---|
| 4,571,734 | * 2/1986 | Dolivo et al. | 375/207 |
| 5,737,368 | * 4/1998 | Shou et al. | 375/343 |
| 5,889,413 | 3/1999 | Bauer | 326/40 |
| 6,157,684 | * 12/2000 | Yang et al. | 375/343 |

OTHER PUBLICATIONS

"The Programmable Logic Data Book" published in 1999, available from Xilinx, Inc., 2100 Logic Drive, San Jose, California 95124, pp 3–1 through 3–22.

* cited by examiner

Primary Examiner—Michael Tokar
Assistant Examiner—Don Phu Le
(74) Attorney, Agent, or Firm—Leroy D. Maunu, Esq; Edel M. Young

(57) ABSTRACT

A matched filter arrangement and an FPGA-implemented tap arrangement for a matched filter are described in various embodiments. In an n-tap filter to match a code sequence, each of taps 1 through (n-1) includes a configurable adder-subtractor. A code storage element is coupled to the adder-subtractor to select either addition or subtraction in accordance with a corresponding bit of the code sequence. The output of the adder-subtractor is coupled to a partial-result storage element, which is part of a chain of partial-result storage elements. The last partial-result storage element in the chain is coupled to the data input of an adder-subtractor in another tap. The last tap includes an adder-subtractor and a single storage element for storage of the final result.

22 Claims, 10 Drawing Sheets

TAP AND MATCHED FILTER ARRANGEMENT

FIELD OF THE INVENTION

The present invention generally relates to digital filters, and more particularly to the implementation of a matched filter on a field programmable gate array (FPGA).

BACKGROUND

Code Division Multiple Access (CDMA) is a rapidly expanding data transmission technique and lies at the heart of the Universal Mobile Telecommunications System (UMTS), which is presently in development in many countries. CDMA transmits data over a wide bandwidth and separates the users of that bandwidth by coding each signal with a unique code sequence. Thus, one of the basic functions required by CDMA is code matching, which commonly implemented using a "matched filter" arrangement.

The matched filter is tuned to detect a given code sequence in a stream of input data. The output of the matched filter is a score that indicates a level of correlation between the input data and the code sequence. A better score indicates a higher correlation.

In a strictly digital environment, the transmitted data can be viewed as a sequence of ±1 values. Although any pattern of values may occur, all transitions occur at regular intervals known as the "chip rate." Thus, one "chip" is the period of time that is spent at a given value. For example, the UMTS chip rate is presently 3.84 MHz with faster chip rates proposed.

One of the more challenging design issues with respect to UMTS is to locate the initial synchronization code sequence having a length of 256 chip periods. The challenge lies in the required computation rate. It will be appreciated that with the arrival of each new sample, the search for 256 bits of a code sequence is required. With no over-sampling and a chip rate of 3.84 MHz, this would require a minimum of (256*3.84 MHz) operations per second (almost 1 Giga-Operation). If the input signal is over-sampled, the number of operations increases by a factor of the over-sample rate. For brevity, the following examples involve 16-bit code sequences.

FIG. 1 shows a 16-bit code sequence being matched to an input stream of data. From left to right, the code includes the sequence of bits: 1100010110101011. The stream of input data is shown above the code, with the first transmitted bit of the stream being at the left and the last transmitted bit of the stream being at the right.

The code can be matched to the input stream by sliding the code along the input stream in one-bit increments and detecting when there is a perfect match between the code bits and the bits of the input samples under consideration. With a code sequence of 16 bits, the ideal match is where the bits of the code are equal to the bits in a portion of the input stream. The match-score at each position of the code relative to the input stream can be computed by counting the number of bits that match. Thus, a perfect match will have a score of 16.

FIG. 1 illustrates a position in the input stream where there is an incomplete match and a position where there is a perfect match. Note that the incomplete match has a score of 8, while the perfect match has a score of 16.

A matched filter can be implemented using the same structure as a Finite Impulse Response (FIR) filter, where the code is stored in multiplier elements of the filter.

FIG. 2 is a functional block diagram illustrating the FIR implementation of a matched filter for the code sequence of FIG. 1. Matched filter 20 includes sample registers 22a–22p for storing the input stream of bits, wherein the input stream is shifted left to right. Filter 20 also includes multiplier elements 24a–24p aand summing element 26. Each of multiplier elements 24a–24p multiplies the bit from a corresponding one of registers 22a–22p by a predetermined code bit of ±1, and summing element 26 totals the outputs from multiplier elements 24a–24p and provides the output "score" which is also referred to as the correlation result. The bitstream is shifted left to right and a new correlation result output with each new input bit of the input stream.

Relative to the example of FIG. 1, two distinctions are noted for the implementation of FIG. 2. First, instead of using 0 and 1 bits to represent bits of the input stream and define the code sequence, −1 and +1 are used. This technique is used to enhance the output score because if a 0 code bit is used, the multiplier output would always be 0 and would not contribute to the score, regardless of whether the input bit matched the code bit. By contrast, when a code bit of −1 is multiplied by a non-matching input bit of +1, the result is −1, which detracts from the output score. The second distinction is that the code sequence of FIG. 1 (1100010110101011) has been reversed in multiplier elements 24a–24p (+1+1 −1+1 −1+1 −1+1+1 −1+1−1 −1+1+1). The reversal is because the input stream is shifted left to right in FIG. 2 as compared to the depiction of the input stream in FIG. 1 where the first bit transmitted is at the left.

In the previous examples, in order to illustrate the basic operation of a matched filter, it has been assumed that the input is a stream of 1's and 0's. In the following paragraphs the matched filter is modified to deal with a digital representation of the analog transmission signal. That is, input samples are words of data, where the value of each word represents a sample taken of an input signal (a point on a waveform oscillating between +1 and −1, for example). Thus, the registers, multiplier elements, and summing element are sized to accommodate input words of data. The second difference from FIG. 2 is that the input signal is over-sampled in order to more accurately determine when the input signal is a +1 or a −1. Thus, each tap of the filter has a number of registers sufficient for the over-sample rate. For example, a 4×over-sample rate requires that each tap have 4 registers for storage of 4 sample values.

FIG. 3 illustrates matched filter 40 including n taps. The taps are indicated with dashed blocks and include respective multiplier elements labeled $*k_0 - *k_{n-1}$. Each of the input registers stores an input word of data of a selected width.

While matched filter 40 appears relatively straightforward to implement in an FPGA, a conventional implementation uses a large portion of an FPGA's programmable resources. For example, matched filters for code sequences having a length of 256 are not uncommon. If, in addition, an 8-bit sample input is assumed with a 4× over-sample rate, 4096 slices of a Virtex™ FPGA (available from Xilinx, Inc. and described at pages 3-1 through 3-22 of "The Programmable Logic Data Book," published in 1999 by Xilinx, Inc. and incorporated herein by reference) are required for the registers (256 taps*4 registers/tap*8 bit delays =8192 flip-flops =4096 slices). Note that 1 slice of a Virtex FPGA includes 2 4-input function generators, 2 flip-flops, and dedicated multiplexer and arithmetic features. In addition to storage for the input samples, 256 multiplier elements are required, including allowing for a 9-bit result, storage for the coefficient, and the multiplication function. Thus, each multiplier element may use 5 slices for a total of 1280 slices for the multiplier elements (256 multiplier elements*5 slices/ multiplier element). A summing element having 256 inputs can be implemented with a very large adder tree, with each level in the tree allowing for additional bits from possible larger values. Thus a total of 255 adders of various sizes are required. For example, in a Virtex FPGA, one 16-bit adder can be implemented in 8 slices (generally, 1 slice/2-bit adder). In an ideal situation, a minimum of 2797 bits of addition are required, thereby occupying a minimum of 1400 slices. Thus, the matched filter would occupy 6776 slices (4096+1280+1400).

Such a conventional matched filter solution for an FPGA uses a large portion of the programmable resources available on the FPGA, thereby making FPGA solutions relatively expensive. An apparatus and method that makes efficient use of FPGA resources and that is fast enough to support oversampling is therefore desirable.

SUMMARY OF THE INVENTION

In various embodiments, the invention provides an FPGA implementation of a tap arrangement for a matched filter and a matched filter. One embodiment provides for an over-sample matched filter implemented on an FPGA. The tap arrangement includes an adder-subtractor, a code storage element, and a plurality of partial-result storage elements. The adder-subtractor has a configuration input, a first data input arranged to receive an input sample value, and a second data input. The adder-subtractor performs addition of data at the first and second data inputs in response to a first signal state at the configuration input and subtraction of data at the first data input from data at the second data input in response to a second signal state at the configuration input. The code storage element is coupled to the configuration input of the adder-subtractor and is arranged for storage of a corresponding bit of a code sequence. The partial-result storage elements are coupled one to another in a chain, and a first one of the partial-result storage elements is coupled to the adder-subtractor output.

In another embodiment, an FPGA-implemented matched filter arrangement is provided. In an n-tap filter to match a code sequence, each of taps 0 through (n-2) includes a configurable adder-subtractor. A code storage element is coupled to the adder-subtractor to select either addition or subtraction in accordance with a corresponding bit of the code sequence. The output of the adder-subtractor is coupled to a partial-result storage element, which is part of a chain of partial-result storage elements. The last partial-result storage element in the chain is coupled to the data input of an adder-subtractor in another tap. The nth tap (tap "n-1") includes an adder-subtractor and a single storage element for storage of the final result.

In yet another embodiment, each tap includes an arithmetic unit that is pre-configured as either an adder or a subtractor depending on the corresponding bit of the code sequence.

In another embodiment an n-bit code sequence is matched using i taps. Each tap includes a configurable adder-subtractor and a code sequence storage element. Each of the code sequence storage elements has storage for n/i bits of the code sequence.

BRIEF DESCRIPTION OF THE DRAWINGS

Various aspects and advantages of the invention will become apparent upon review of the following detailed description and upon reference to the drawings in which.

DETAILED DESCRIPTION

Figure 4A:
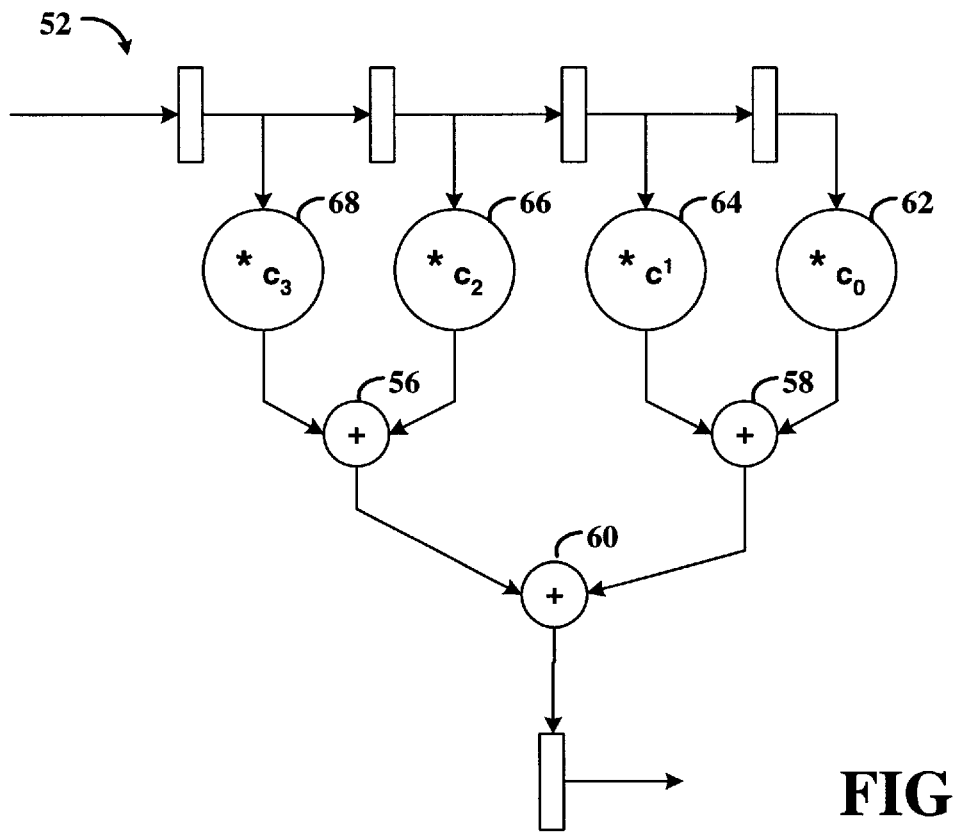
FIG. 4A depicts one example implementation of a matched filter.
Figure 4B:
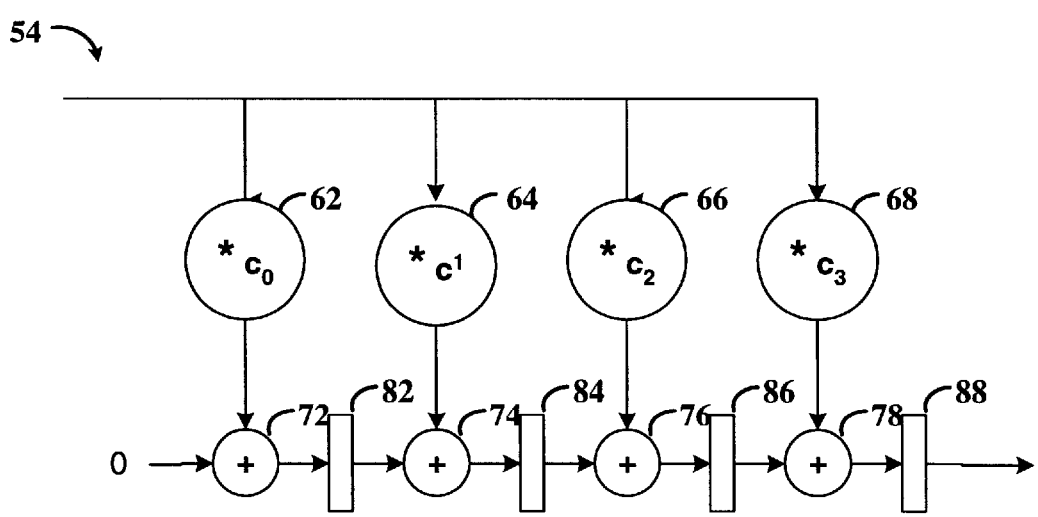
FIG. 4B is an inverse FIR structure which implements a matched filter.

FIG. 4A depicts one example implementation of a matched filter 52, and FIG. 4B depicts another, functionally equivalent, matched filter 54. In FIG. 4A, the matched filter function is implemented using a FIR filter structure, which includes an adder tree comprised of adders 56, 58, and 60. The code sequence is implemented within multiplier elements 62, 64, 66, and 68. The first bit of the code is designated as $c_0$ the second bit is $c_1$, the third bit is $c_2$, and the fourth bit is $c_3$.

FIG. 4B is an inverse FIR structure which implements a matched filter. Those skilled in the art will recognize that filter 54 is functionally equivalent to filter 52. As compared to filter 52, an input sample is input to all of multiplier elements 62, 64, 66, and 68 at the same time, and the order of the multiplier elements is reversed. Filter 54 does not include an adder tree as does filter 52. Instead, a chain of adders 72, 74, 76, and 78 is used to sum the outputs of multipliers 62, 64, 66, and 68. Each of registers 82, 84, and 86 is used to accumulate a partial result of the filter output. Register 88 contains the final result of the code match function.

Application of the inverse FIR structure to filter 54 provides a lower input-to-output latency than does filter 52. The adder tree of filter 52 will most likely need to be pipelined to achieve performance required for the practical operations and will insert latency. That is, the input-tooutput latency of filter 52 will increase with the number of multiplier elements and will further increase with the height of the adder tree. By contrast, the input-to-output latency of filter 54 will simply increase with the number of multiplier elements, and the addition operation will not add further latency.

Figure 5A:
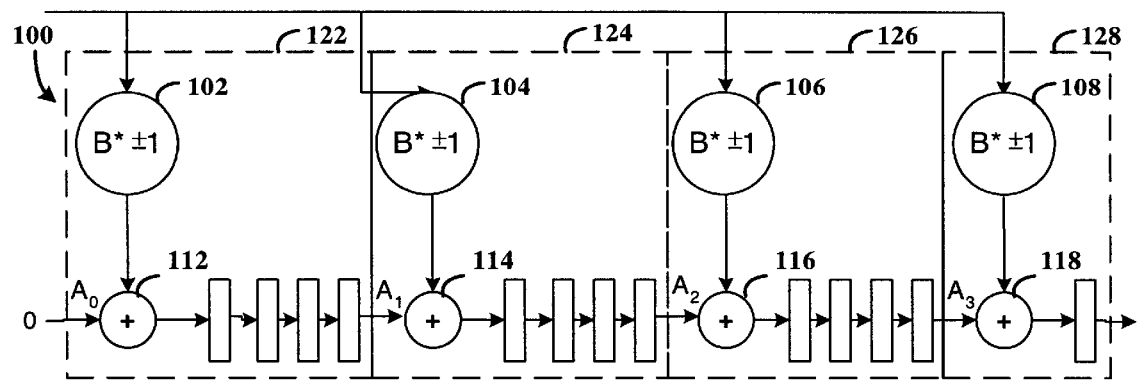
FIG. 5A is a block diagram of an example matched filter for a 4-bit code sequence and 4× over-sampled input, constructed in accordance with an inverse FIR filter structure.

FIG. 5A is a block diagram of an example matched filter 100 for a 4-bit code sequence and 4x over-sampled input, constructed in accordance with an inverse FIR filter structure. The taps of filter 100 are indicated by dashed blocks. Each of multiplier elements 102, 104, 106, and 108 multiplies an input sample value, B, by ±1, depending on the particular code bit, and adders 112, 114, 116, and 118 add output from the respectively coupled one of the multiplier elements to output from the previous tap.

Each of taps 122, 124, and 126 includes four "partial-result" or "delay" registers since the example filter is 4x over-sampled. Tap 108, being the last tap in the chain, includes only one register, which contains the final result.

For ease of implementation and usage of a common tap structure, the number of bits in each delay register indicates the size of the potential final result at the filter output. This bit size is a function of both the number of bits entering the filter as samples and the number of taps. In the example, each input to the multiplier is assumed to be 8 bits wide. In this example, the input to the filter, and hence the input to each multiplier is assumed to be a two's-complement signed number 8 bits wide. The filter will perform a correlation with a 4 bit code sequence using 4 taps. Thus, the maximum possible size is the sum of 4 maximum values each represented by 8 bits (−128×−1×4 =+512), which would require an 11 bit result. It will be appreciated, however, that a code sequence having all bits set to −1 is unlikely. Thus, it may be assumed that all results will be in the range −512 to +511, which is covered by 10 bits. The output bit size can be set by the number of bits plus n, where $2n$ is the number of taps. Thus, for 4 taps, n=2, and for 256 taps, n=8. An 8-bit input sample plus a 256-bit code squence requires 16 bits.

It can be seen that each of adders 112, 114, 116, and 118 receives as inputs an output from a previous tap (except the first tap receives the input value 0) and an output from a multiplier. In matched filters, the multiplication is by either +1 or −1. Thus, if B is considered to be the sample and $A_i$ is the input partial result, then the output of the adder can be expressed as $A_i+(B*(\pm 1))$, which is equal to $A_i \pm B$. Thus, each tap can be implemented by an adder-subtractor. Thus the structure of FIG. 5A can be simplified.

Figure 5B:
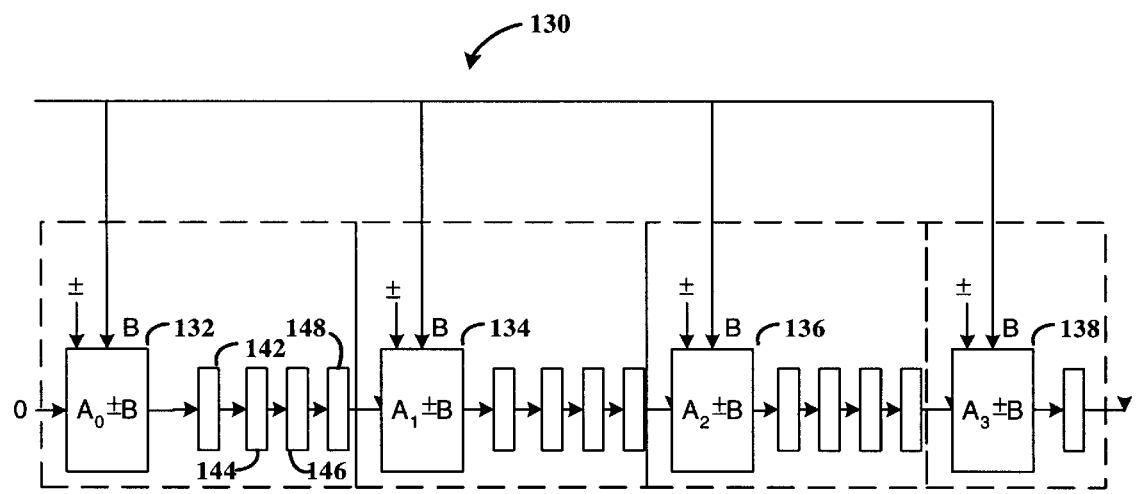
FIG. 5B illustrates an example 4-tap matched filter in which adder-subtractors replace the adders and multiplier elements in the tap of a matched filter.

FIG. 5B illustrates an example 4-tap matched filter 130 in which adder-subtractors replace the adders and multiplier elements in the taps of a matched filter. Adder-subtractors 132, 134, 136, and 138 all receive input sample B and add or subtract the input sample from the other input $A_i$. For each of the code bits in the code sequence, a corresponding input signal is provided to each adder subtractor to configure the adder-subtractor for either addition or subtraction. For the example 4-tap matched filter 130 with 8-bit samples, each adder-subtractor 132, 134, 136 and 138 is 10 bits wide and can be implemented in 5 slices of a Virtex FPGA.

In the example matched filter, in each of the taps, in addition to the first partial-result register (i.e. 142) that is included as part of the resources that accompany an adder-subtractor, there are three additional partial-result registers (i.e. 144, 146, 148). The first register is implemented within the same slices that implement the adder-subtractor, and therefore consumes no additional slices.

In another example (not shown), a 256-tap matched filter with 8-bit samples and a 4x over-sample rate is considered. In this example, each partial-result register is implemented as explained above to accommodate 16 bits. Thus, each tap requires 48 flip-flops (3 registers*16 bits) to implement the example delay. Implementing 48 flip-flops on a Virtex FPGA would require 24 slices at 2 flip-flops/slice. For a 256 tap matched filter, the three additional delays would require 6144 slices (24 slices*256 taps) or 12288 flip-flops.

Figure 1:
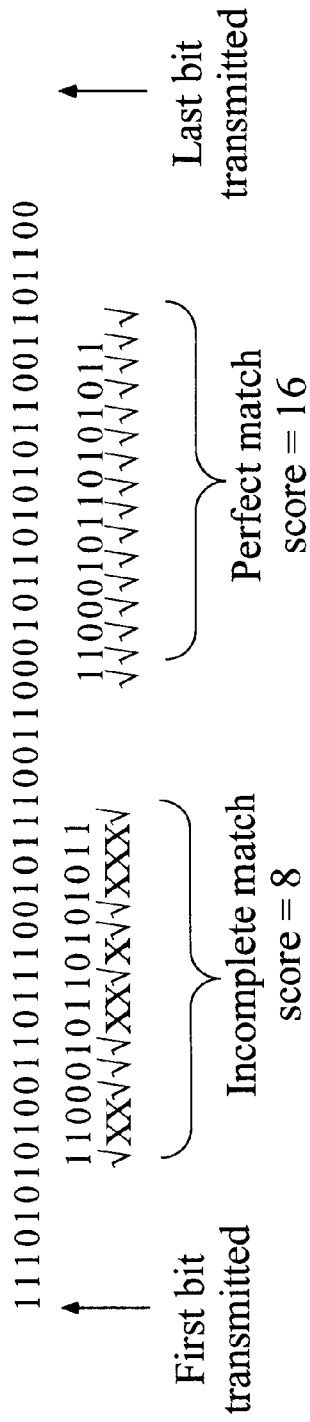
FIG. 1 shows a 16-bit code being matched to an input stream of data.
Figure 2:
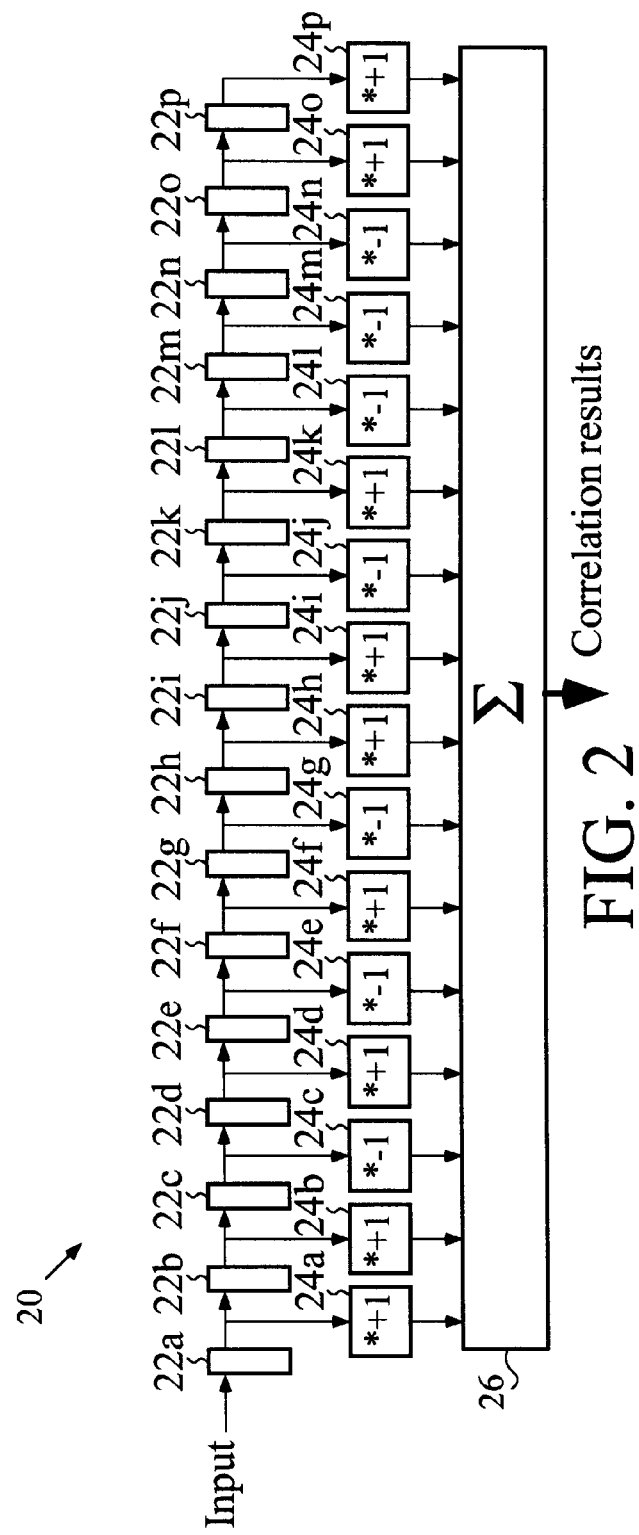
FIG. 2 is a functional block diagram illustrating the FIR implementation of a matched filter for the code sequence of FIG. 1.
Figure 3:
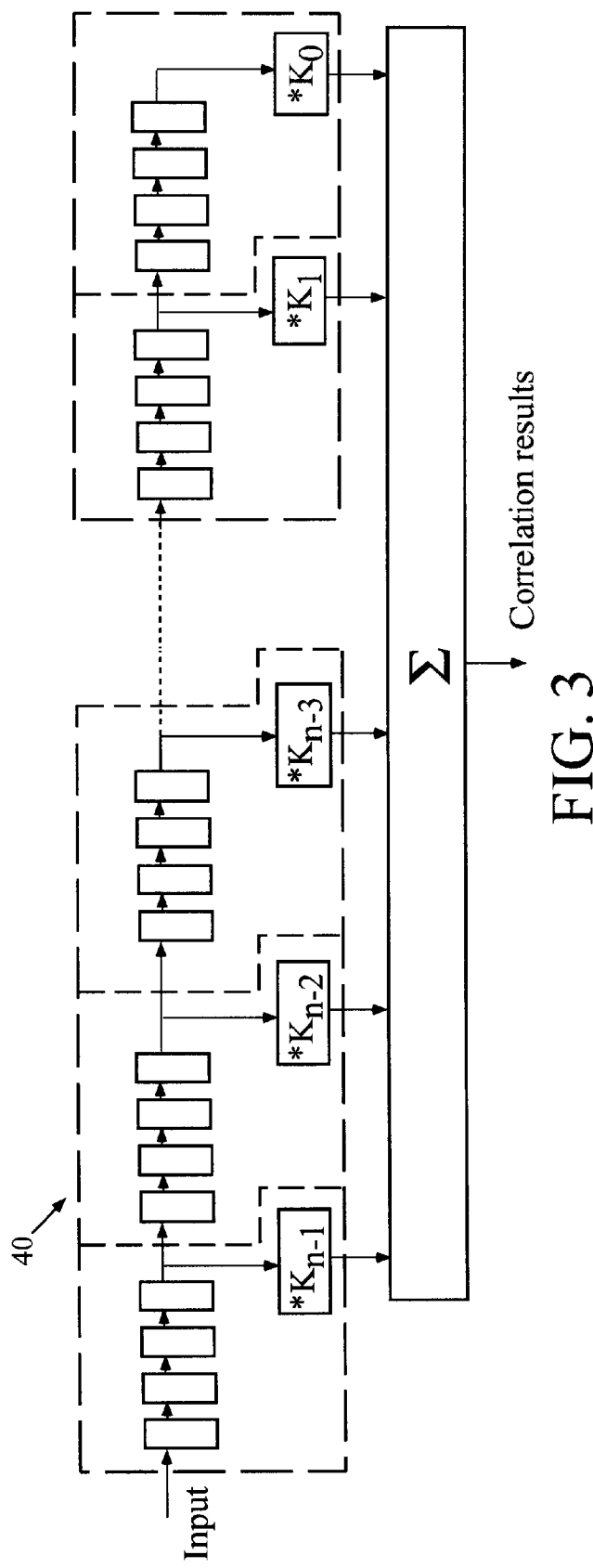
FIG. 3 illustrates matched filter 40 including n taps.

Since matched filters having 256 taps are not uncommon, the number of programmable resources required by filter 130 may be too large to be economical, or larger than an implementation of filter 40 of FIG. 3. To address this, it has been recognized that the partial-results registers in each of the taps can be more economically implemented.

The first partial result register (for example, register 142 in the first tap) in each of the taps need not consume any additional storage since each slice used to implement 2 bits of the adder-subtractor function also includes storage for two bits of output. The remaining registers (for example, registers 144, 146, and 148) are used for storage of the partial results and for delaying input of the partial results to the next adder in the chain until the correct time. Registers 142, 144, 146, and 148 may be referenced herein as "partial results registers," or "delay registers". In one embodiment, elements 144–148 can be implemented by configuring function generators of an FPGA to act as shift registers. The number of function generators corresponds to the number of bits used to represent the partial results (the "width of the bus"). In a Virtex device, one 16-bit LUT can be configured as a shift register, and the number of delays introduced by the shift register is programmable, with a maximum of 16 delays. The flip-flop associated with each function generator within a Virtex slice can be used as an additional delay, thereby increasing the maximum to 17 delays. Implementing a function generator (lookup table) as a shift register is described in U.S. Pat. No. 5,889,413 entitled, "LOOKUP TABLES WHICH DOUBLE AS SHIFT REGISTERS" by Trevor J. Bauer, the contents of which are incorporated herein by reference.

It will be appreciated that adder-subtractors can be conventionally implemented as parallel adders. In an alternative embodiment, the various embodiments described herein could be restructured to accommodate serial arithmetic.

Figure 6:
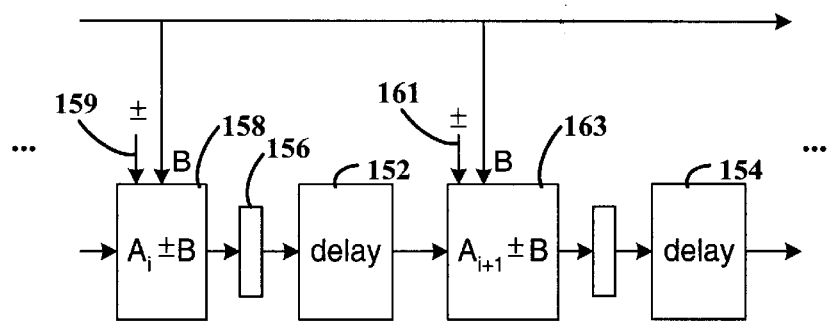
FIG. 6 shows two taps of an example matched filter having n taps in which one or more partial-result registers have been replaced with respective delay elements.

FIG. 6 shows two taps of an example matched filter having n taps in which one or more partial-result registers have been replaced with respective delay elements. The first tap includes delay element 152, and the second tap includes delay element 154. Delay elements 152 and 154 provide storage for the partial results and also introduce a time delay for each partial result, wherein the time delay is a function of the over-sample rate. For example, for a 4x over-sample rate, 4 delays are required. Since the first partial result register in a tap (for example, register 156) accompanies the adder-subtractor and introduces one unit of delay, 3 delay units are required of each delay element 152 and 154 in each of the taps.

Code input signals are provided on lines 159 and 161 to adder-subtractors 158 and 163, respectively. In one embodiment, the code bits could be stored in flip-flops having outputs coupled to the add/subtract control inputs of respective adder-subtractors. In another embodiment, the code bits could be implemented by individual adders and subtractors that replace the adder-subtractors.

Figure 7:
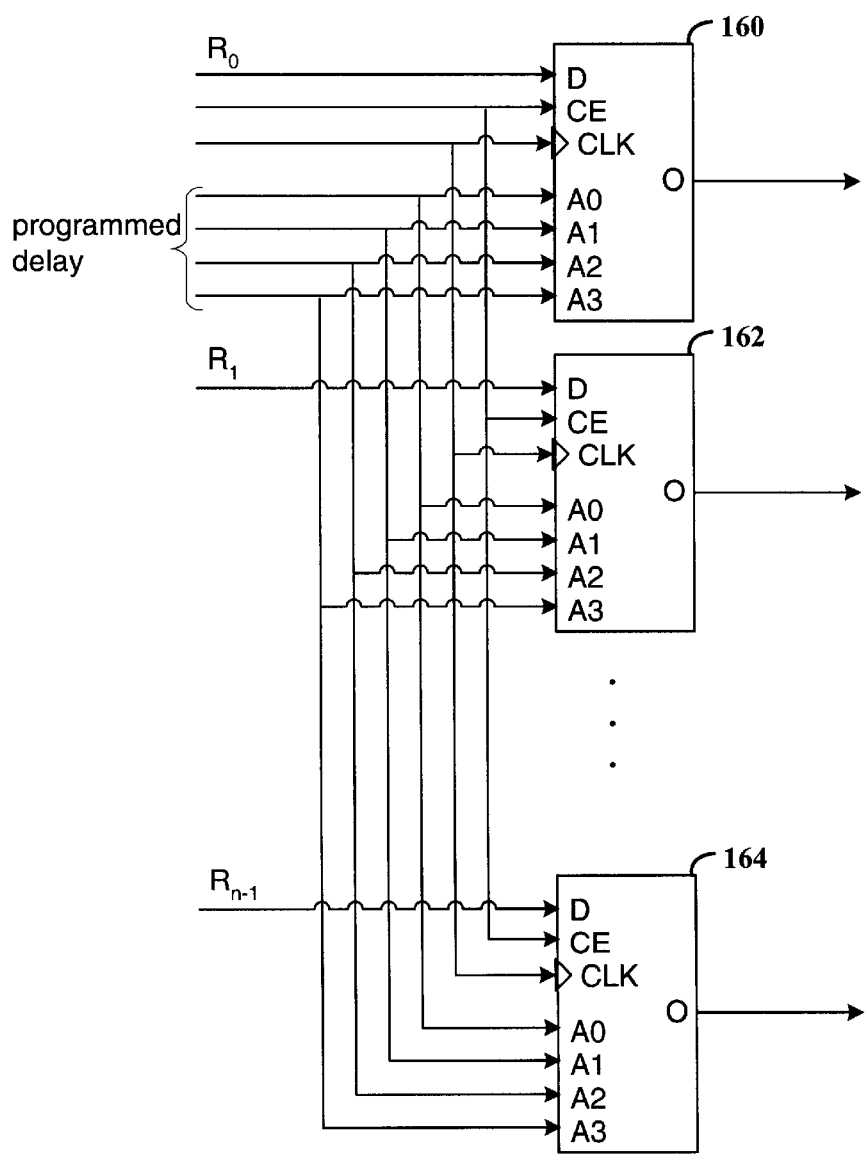
FIG. 7 is a block diagram showing a plurality of function generators, each configured as a shift register.

FIG. 7 is a block diagram showing a plurality of function generators 160, 162, and 164, each configured as a shift register. Each of shift registers 160, 162, and 164 stores and shifts one bit of the input result. For a 16-bit result, shift register 160 stores bit 0, shift register 162 stores bit 1, and shift register 164 stores bit 15. Thus, the result is spread across 16 shift registers. When a new result is generated (output from register 156, FIG. 6, for example), the contents of the shift registers are shifted, and a new result is input to the data ports (D) of the shift registers. In one embodiment, the clock enable (CE) is permanently enabled.

The shift register implements the number of delays provided by a delay circuit (152 or 154) and the delay is selected by delay signals that are input on address ports A[3:0]. In one embodiment using 4-input function generators each with 16 memory cells, the function generator is configurable as a 15-bit shift register. With 4 inputs, up to 16 delays can be implemented. However, since each adder-subtractor includes a register for one of the delays, only 15 of the maximum 16 delays are used for a 16× over-sample rate.

After a bit of result data reaches the last stage of the shift register, it is provided on the output port (0). The adder-subtractor of the next tap processes bits output from the delay circuit.

Over-sample rates greater than 16× (the number of possible delays in one shift register) can be implemented with additional shift registers coupled to outputs of the first set of function generators and programmed with address signals to implement the desired shift-delay.

For up to 16 delays, each of delay circuits 152 and 154 requires one function generator per bit of data. Thus, a 256-tap matched filter with 16-bit results requires 256*16=4096 function generators (2048 slices). Since a 4-input function generator can be programmed for up to 16 delays, the number of function generators required to implement a matched filter having an 8 × or a 16 × over-sample rate would be the same as for a 4× over-sample rate. Note that the 4096 function generators would be replacing 61440 flip-flops (for 16 × over-sampling) in a flip-flop delay register implementation. Thus, the filter arrangement embodiments of FIGS. 5B, 6, and 7 scale well for large over-sample-rate matched filters.

Figure 8:
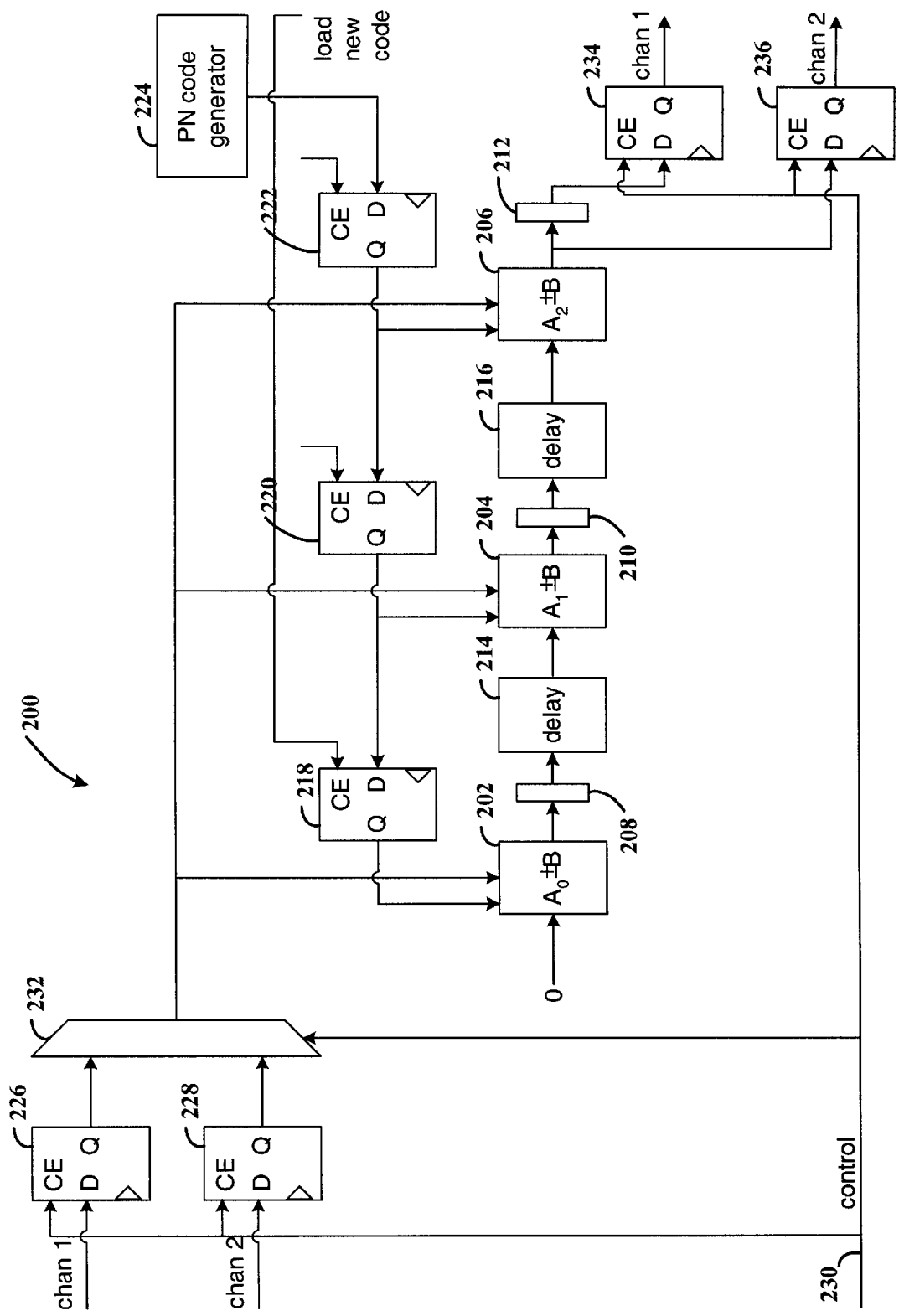
FIG. 8 is a block diagram of an embodiment of the invention implementing an example 2-channel matched filter.

FIG. 8 is a block diagram of an embodiment of the invention implementing an example 2-channel matched filter 200 that uses a multiplexer 232 to alternately input the two channels to filter 200 for processing and then after processing separates the two channels. For brevity, filter 200 has 3 taps, including adder-subtractors 202, 204, and 206. Each of adder-subtractors 202, 204, and 206 is coupled to a respective one of result registers 208, 210, and 212. The first and second taps include delay elements 214 and 216, respectively. Code bits that configure adder-subtractors 202, 204, and 206 are stored in flip-flops 218, 220, and 222. In one embodiment, the code bits are generated by a pseudo-random-noise code generator element 224 and are serially shifted into flip-flops 222, 220, and 218. Once the code sequence has been shifted in, it is held static by de-asserting the CE inputs to flip-flops 218, 220, and 222.

Input sample values for channels 1 and 2 are stored in registers 226 and 228, respectively, each being 8 bits wide, for example. A control signal on line 230 enables storage of sample values in registers 226 and 228, selects sample inputs from channels 1 and 2 via multiplexer 232, and enables storage of output results in registers 234 and 236.

If, for example, each channel has an 8 × over-sample rate of a chip-rate of 3.84 MHz, then matched filter 200 must operate at 61.44 MHz (16 × the chip-rate). Thus, each of delay elements 214 and 216 implements 15 delays. The control signal on line 230 is one-half the frequency of the example 61.44 MHz clock rate. On the first clock cycle, the inputs on channels 1 and 2 are captured in registers 226 and 228. Multiplexer 232 then applies the channel 1 input to the three taps so that on the next clock cycle the channel 1 input is processed by adder-subtractors 202, 204, and 206. The partial results are accumulated through the taps, and the final result for channel 1 is stored in register 212. On the clock cycle following the input of the channel 1 input to adder-subtractors 202, 204, and 206, multiplexer 232 applies the channel 2 sample input (control signal being low) to adder-subtractors 202, 204, and 206. The second control signal cycle also enables storage of results in output registers 234 and 236. Since the channel 2 result is taken directly from adder-subtractor 206 and the channel 1 result is delayed by register 212, the two channel results are seen to be aligned and operating at the single channel data rate of 8 × the chip-rate.

Figure 9:
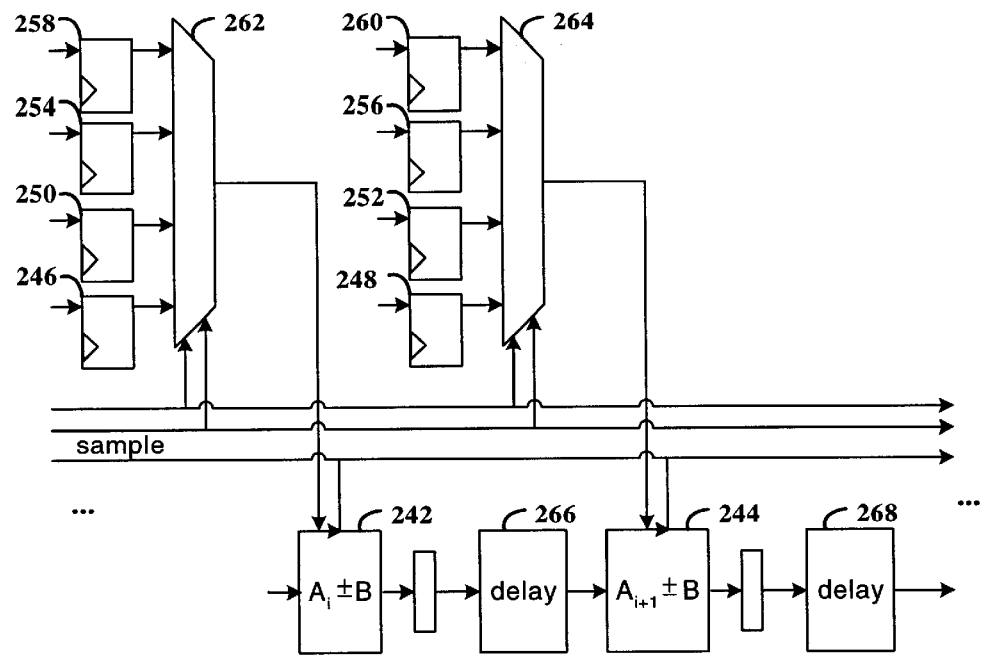
FIG. 9 is a block diagram of a first embodiment that implements a matched filter having multiples code sequences.
Figure 10:
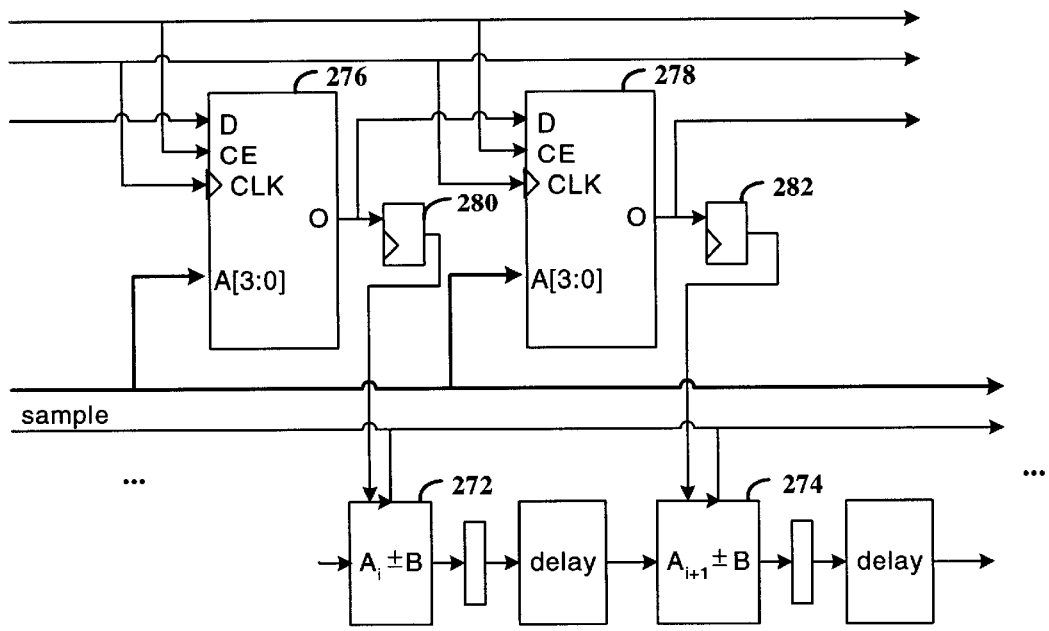
FIG. 10 is a block diagram of a second embodiment that implements a matched filter having multiples code sequences.

Those skilled in the art will appreciate that the matched filter of FIG. 8 could be expanded to accommodate more than two channels by varying the over-sample rate, the number of channel input/output registers, and the rate of the control signal relative to the chip-clock. As shown in FIGS. 9 and 10 and described below, flip-flops 218, 220, and 222 and PN code generator 224 can be replaced with storage for different code sequences for the different channels.

FIG. 9 is a block diagram of one embodiment for implementing a matched filter having multiple code sequences. Application of multiple codes may be desirable to fully use the cycles that are available in the filter. For example, for a 4× over-sample rate (4*3.84 MHz MHz) the filter operates at 16.384 MHz, which is extremely slow for a Virtex FPGA. Thus, a great deal of chip-performance is left unused. This unused capacity can by exploited by increasing the over-sample rate to 16 ×, or alternatively, applying different code sequences on different clock cycles. For example, four—4× over-sample rate channels can be implemented with a single matched filter capable of applying four different code sequences and computing 4 separate matching score results.

Two taps, $tap_i$ and $tap_{i+1}$, of a matched filter are shown. The matched filter applies 4 different code sequences to adder-subtractors 242 and 244. Bits i and i+b 1of the first code sequence are stored in flip-flops 246 and 248, bits i and i+1 of the second code sequence are stored in flip-flops 250 and 252, bits i and i+1 of the third code sequence are stored in flip-flops 254 and 256, and bits i and i+1 of the fourth code sequence are stored in flip-flops 258 and 260. Each code sequence applied to its respective adder/subtractor 242 or 244 in alignment with the input channel sample being applied to all taps on the given clock cycle. Multiplexers 262 and 264 apply bits i and i+1 of the four code sequences. Delay elements 266 and 268 implement 15 delays.

It will be appreciated that adding additional code sequences would increase the number of flip-flops and size of the multiplexer for each tap. At the 16-delay limit, 16 different codes can be matched on samples received at the chip-rate (no over-sampling). Thus, each tap would require 16 flip-flops and a 16:1 multiplexer.

FIG. 10 is a block diagram of another embodiment of a matched filter having multiple code sequences. The matched filter of FIG. 10 uses shift registers for storing the different code sequences as compared to the flip-flops of FIG. 9. When the shift registers are implemented using function generators of a Virtex FPGA, for example, one shift register can be used to store a bit-slice of up to 16 different code sequences (as compared to up to 8 Virtex slices when implemented using flip-flops). Thus, the number of function generators required for m n-bit sequences (where m is <=16)

is n, where one function generator occupies one-half a slice of a Virtex FPGA.

Two taps, $tap_i$ and $tap_{i+1}$, of a matched filter are shown. The matched filter applies a plurality of different code sequences to adder-subtractors 272 and 274 of the taps. Bits i and i+1 of the of the different code sequences are stored in shift registers 276 and 278, respectively. Prior to operation, the code sequences are loaded into shift registers 276 and 278 by serially shifting data into the registers. The address lines are held constant such that the delay realized by shift registers 276 and 278 is equal to the number of code sequences to be stored, and the bits are shifted-in in the order of $CS1_0$ $CS2_0$, $CS3_0$, . . . $CSm_0$, $CS1_1$, $CS2_1$, $CS3_1$, $CSm_l$, . . . $CS1_n$, $CS2_n$, $CS3_n$, . . . $CSm_n$ (where $CSi_j$ represents code sequence i, bit j). During operation, the clock-enable signal is held low to prevent shifting of the code sequence, and the individual code sequence bits are addressed using the address inputs A[3:0] and accessed via the output ports (0). It will be appreciated that the code sequences may be accessed in any desired order, although typically, the addressing will be sequential. Flip-flops 280 and 282 are associated with the function generators used to implement shift registers 276 and 278. Flip-flops 280 and 282 are optional but may be inserted to increase overall performance.

Another use for the above described embodiments is comparing different code sequences to the same sample input. Thus, the sample input is held for multiple clock cycles while the different codes are applied. This would enable a chip-rate sample to be tested for 16 different code sequences. Alternatively, a 4× over-sample data stream could be tested for 4 code sequences. In still another application, multiple interlaced channels could be correlated with multiple code sequences. For example, 4 channels having a 2 × over-sample rate could have each sample applied twice to correlate to 2 code sequences. Alternatively, the same code sequence may be applied to different channels. Those skilled in the art will recognize that various combinations involving numbers of channels and numbers of code sequences could be implemented using principles of the previously described embodiments.

The appropriate application of data samples and code sequences may also be used to realize a complex matched filter from the structures described. For example, a complex filter can be broken down into 4 linear filters as follows:

$$[(R_1+jI_1) \times (Rk_1+jIk_1)] + [(R_2+jI_2) \times (Rk_2+jIk_2)] + [(R_3+jI_3) \times (Rk_3+jIk_3)] =$$

$$[(R_1 \times Rk_1 + I_1 \times Ik_1) + j(R_1 \times Ik_1 + I_1 \times Rk_1)] +$$

$$[(R_2 \times Rk_2 + I_2 \times Ik_2) + j(R_2 \times Ik_2 + I_2 \times Rk_2)] +$$

$$[(R_3 \times Rk_3 + I_3 \times Ik_3) + j(R_3 \times Ik_3 + I_3 \times Rk_3)] =$$

$$[(R_1 \times Rk_1 + R_2 \times Rk_2 + R_3 \times Rk_3) - (I_1 \times Ik_1 + I_2 \times Ik_2 + I_3 \times Ik_3)] + j[(R_1 \times Ik_1 + R_2 \times Ik_2 + R_3 \times Ik_3) + (I_1 \times Rk_1 + I_2 \times Rk_2 + I_3 \times Rk_3)]$$

Thus, any complex sample can be applied and repeated in the sequence: real, imaginary, imaginary, real. A small reforming stage can then construct the complex correlation result. As explained above, over-sample or multiple channels can be used to increase the usage to 16 clock cycles of time sharing. The structure for applying multiple code sequences can also be applied to more fully exploit the performance of an FPGA-implemented matched filter with a single channel and single code.

Figure 11A:
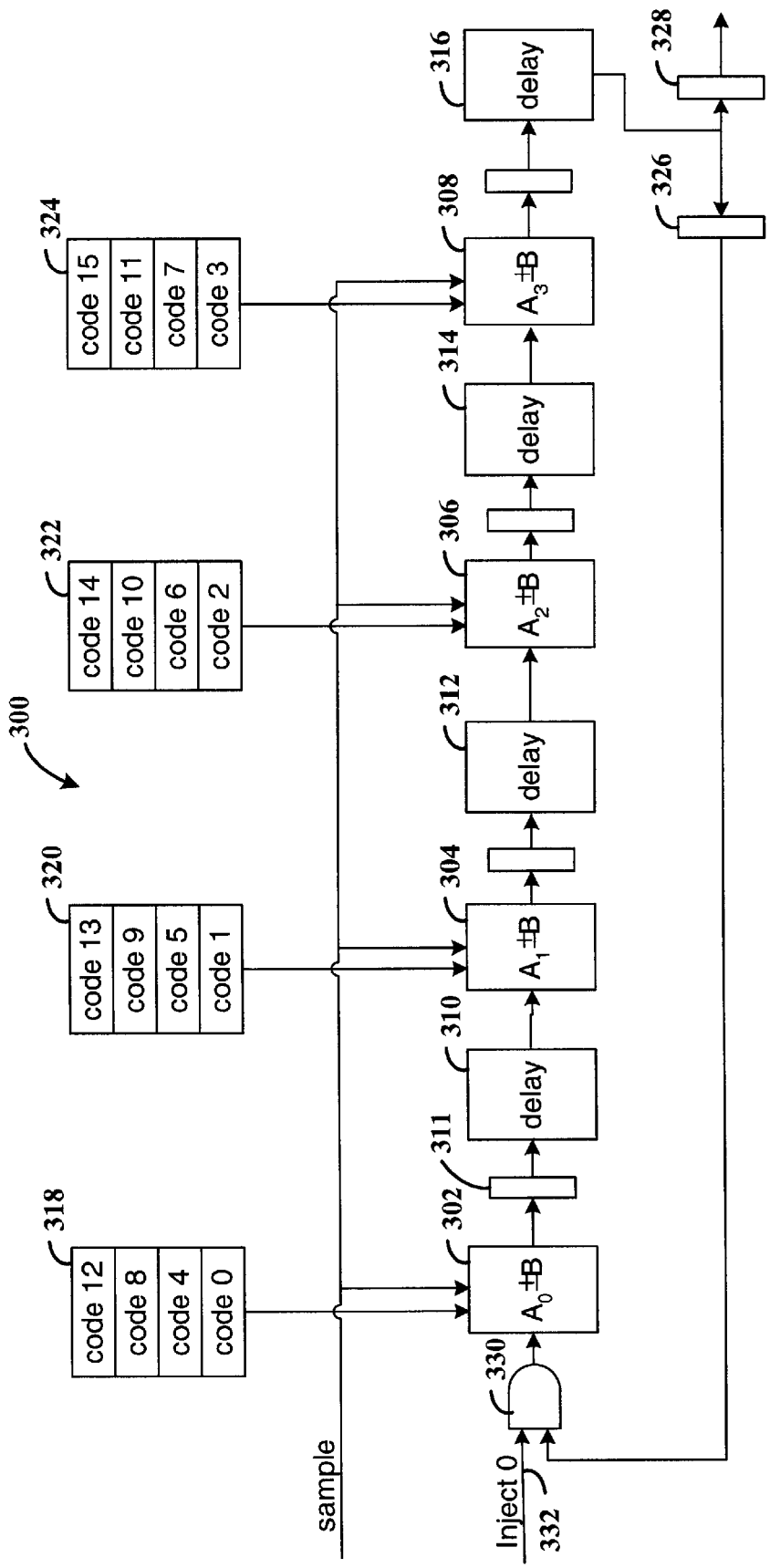
FIG. 11A is a block diagram of an example folded filter arrangement.

FIG. 11A is a block diagram of an example folded filter arrangement 300. The example assumes a 4× over-sample rate and a code sequence having a length of 16 bits. It will be appreciated that filter 300 can be scaled for other sample rates and sequence lengths. The filter is "folded" in the sense that 4 taps achieve the work of 16 taps as set forth in the previously described embodiments. Each tap includes a respective adder-subtractor 302, 304, 306, or 308, delay element 310, 312, 314, or 316, and storage element 318, 320, 322, or 324. Register 311 of the first tap stores the partial result output from adder-subtractor 302.

Each of storage elements 318, 320, 322, and 324 provides storage for 4 bits of the example 16-bit code sequence. For one sample input, the processing is as follows. Bits 0–3 of the code sequence are input to taps 1–4 and scored in parallel with the sample input, and the partial results are stored in the respective delay registers. Then bits 4–7 are scored in parallel with the sample input, with the partial results for bits 0–3 being shifted and the new partial results for bits 4–7 being stored in the respective delay registers. Next, bits 8–11 are scored in parallel with the sample input, again shifting the prior partial results and storing the new partial results. Finally, bits 12–15 are scored in parallel with the sample input. The partial results are held in the respective delay registers of the taps and provided as input to the following tap. The process is repeated for subsequent samples, with the partial results being fed-back to the first tap.

Holding register 326 stores a partial result for feedback input to adder-subtractor 302 of the first tap, and capture register 328 stores the final result. Holding register 326 gets updated as each new partial result is generated, while the capture register only gets updated with the final result obtained on the last cycle (when bits 12–15 were applied). This ensures that output results are produced at the rate of the input samples which is the over-sample rate. This is one clock cycle before the "inject 0" signal is used to start the new sample.

AND gate 330 is used to input a 0 to adder-subtractor 302 of the first tap at the time a new sample is input. Thus, the inject 0 signal on line 332 is controlled to input 0 at the over-sample rate.

Figure 11B:
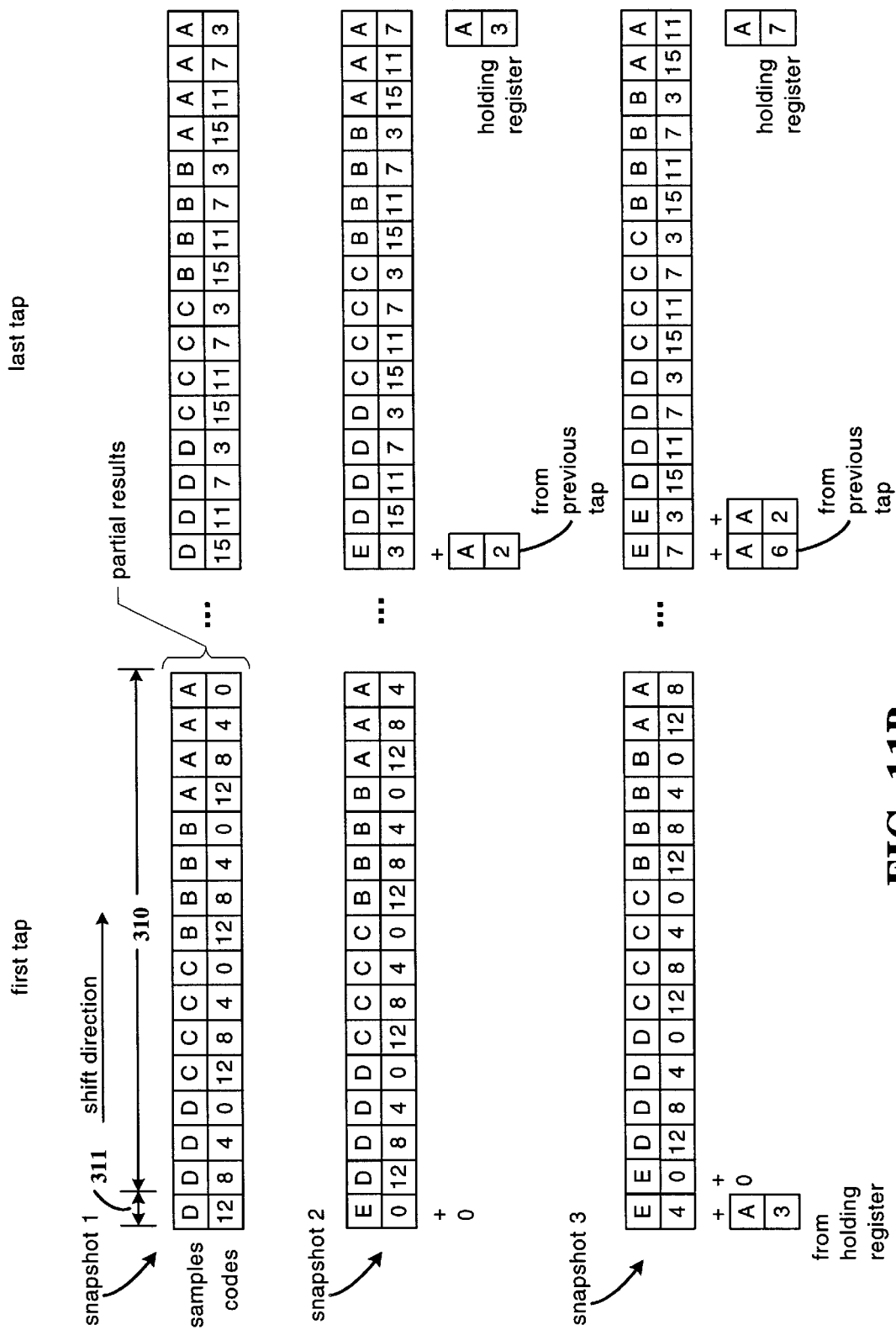
FIG. 11B illustrates processing of samples A, B, C, D, and E by the structure of FIG. 11A.

FIG. 11B illustrates processing of samples A, B, C, D, and E by the structure of FIG. 11A. Snapshots taken at three different times of the contents of 16 delay elements for the first and last taps are shown, with the shift sequence being from left to right. The 16 delay elements are comprised of the register associated with the tap's adder-subtractor, and the delay element that implements the remaining 15 delays, for example. In reference to the first tap, the partial result generated from code bit 12 and input sample D are stored in register 311 of the first tap, and the remaining 15 partial results of the first tap are stored in delay element 310.

At snapshot 1, it is assumed that matched filter 300 began with all delay elements having the value 0, and the delay elements'contents are shown after having processed samples A–D over 16 cycles.

At snapshot 2, a new sample E is input and the contents of the delay elements have been shifted right by one element. Given the over-sample rate, the new sample E must be correlated with sample A. The first tap adder-subtractor 302 must be presented with a 0 input to add to sample E, bit 0 because adder-subtractor 302 represents the first tap of the "complete" 16 tap filter on this particular clock cycle (comparable to 0 entering adder-subtractor 132 of FIG. 5B). The contents of register 311 is updated with the total of the value 0 added to the partial result of sample E scored with code bit 0 (E0+0). Similarly in the last tap (tap 4), the partial result of sample A scored with code-bit 2 from tap 3 is accumulated with the new sample E scored with code bit 3 (E3+A2). The partial result, A3, is also shifted into the holding register at snapshot 2. At snapshot 3, the new sample E continues to be applied for scoring with code bits 4–7. The contents of the delay elements have been shifted right by one element from snapshot 2. In the first tap, adder-subtractor 302 accumulates the contents of the holding register (A3) with E scored with code bit 4 (E4) and the partial results are stored in register 311. At tap 4, the partial result of sample A, code bit 6 (A6) is accumulated with sample E, code bit 7 (E7). The partial result in the last stage of delay element 316 has been shifted into holding register 326.

Capture register 328 is enabled to store output from delay element 316 when sample E is applied for the fourth time to be correlated with bits 12–15, at which time the fourth tap represents the $16_{th}$ and final tap of filter 300.

Figure 12:
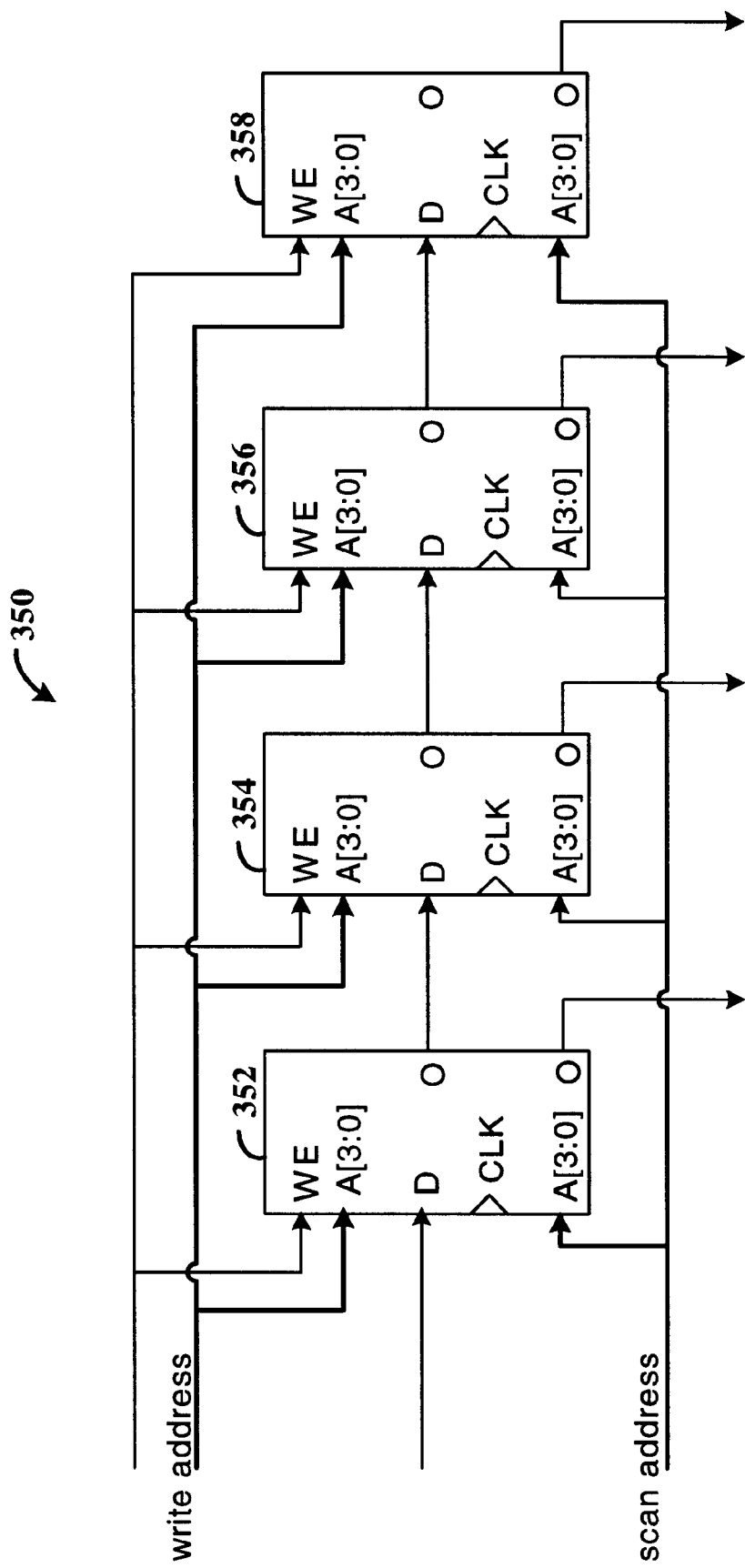
FIG. 12 is a block diagram of one embodiment of an FPGA-implemented circuit for providing code bits in an example folded matched filter.

FIG. 12 is a block diagram of one embodiment 350 of an FPGA-implemented circuit for providing code bits in an example folded matched filter. The matched filter in which circuit 350 can be used is an example 4-tap filter comparable to that shown in FIG. 11A. Circuit 350 is generally a distributed dual-port RAM, including individual dual-port RAMs 352, 354, 356, and 358. Each of the dual-ports RAMS has two address ports and two output ports. The first output port of the RAM 352 is coupled to the data input port of RAM 354, the first output port of RAM 354 is coupled to the data input port of RAM 356, and the first output port of RAM 356 is coupled to the data input port of RAM 358.

In loading the code bits into RAMs 352, 354, 356, and 358, a left-to-right serial input is illustrated. However, it will be appreciated that relative to the code bits illustrated in FIG. 11A, a right-to-left input would be required. Thus, for purposes of explanation, RAM 358 corresponds to storage element 318 (FIG. 11A), RAM 356 corresponds to storage element 320, RAM 354 corresponds to storage element 322, and RAM 352 corresponds to storage element 324.

To load an example 16-bit code sequence, the first four bits (0–3) of the code sequence are serially loaded into RAM 352 and shifted to RAMs 354, 356, and 358 while holding the write address at '0000' at the first address port. Thus, code bit 0 is first provided as data input to RAM 352. While maintaining the address signals at '0000', Code bit 1 is then provided as input to RAM 352, which shifts code bit 0 to address '0000 ' of RAM 354 and writes code bit 1 to address '0000' of RAM 352. The process is repeated for code bits 2 and 3. Thus, after loading the first four code bits, the contents of addresses '0000' of RAMs 358, 356, 354, and 352 are code bits 0, 1, 2, and 3, respectively. To load the next four code bits (4–7), the address is incremented to '0001' and the bits are input in the same manner as described for code bits 0–3. The process is then repeated for code bits 8–11 and 12–15 so that the contents of RAMs 358, 356, 354, and 352 reflect the contents of storage elements 318, 320, 322, and 324 of FIG. 11A. After all the code bits have been loaded, the write-enable signal is disabled.

During operation, a scan address in provided as input to the second address ports of RAMs 352, 354, 356, and 358, and the addressed code bits are output on the second output port.

Circuit 350 uses one Virtex slice for up to 16 code bits, which supports filter-folding up to 16 times. Thus, a 256 tap filter operating at chip rate could be realized using a 16-tap version of matched filter 300 (FIG. 11A). Delay elements 310, 312, 314, and 316 would be set to 15 delays (for a total of 16 delays when combined with register 311). The use of a whole slice versus a half slice (half slice shown in FIG. 10) means that the code sequence can be loaded in the natural sequence in which it may be generated from a PN generator. Otherwise, the code bits would be loaded in the order 0, 4, 8, 12, 1, 5, 9, 13, ..., 15.

The present invention is believed to be applicable to a variety of programmable logic devices and has been found to be particularly applicable and beneficial in Xilinx FPGAs. While the present invention is not so limited, an appreciation of the present invention has been provided by way of specific examples involving FPGAs. Other aspects and embodiments of the present invention will be apparent to those skilled in the art from consideration of the specification and practice of the invention disclosed herein. It is intended that the specification and illustrated embodiments be considered as examples only, with the true scope and spirit of the invention being indicated by the following claims.

What is claimed is:

1. A tap arrangement for an over-sample matched filter implemented on an FPGA, comprising:

an adder-subtractor having an output, a configuration input, a first data input arranged to receive an input sample value, and a second data input, wherein the adder-subtractor performs addition of data at the first and second data inputs in response to a first signal state at the configuration input and subtraction of data at the first data input from data at the second data input in response to a second signal state at the configuration input;

a code storage element coupled to the configuration input of the adder-subtractor; and a plurality of partial-result storage elements coupled one to another in a chain, a first one of the partial-result storage elements coupled to the adder-subtractor output.

2. The tap of claim 1, wherein one or more of the partial-result storage elements are implemented on function generators of an FPGA configured as shift registers.

3. The filter of claim 2, wherein each of the shift registers is configured with a shift size as a function of an over-sample rate.

4. The tap of claim 1, wherein the adder-subtractor is implemented on a plurality of function generators of an FPGA.

5. A matched filter arrangement implemented on an FPGA, comprising:

a plurality of taps, each tap including an adder-subtractor having an output, a configuration input, a first data input arranged to receive an input sample value, and a second data input, wherein the adder-subtractor performs addition of data at the first and second data inputs in response to a first signal state at the configuration input and subtraction of data at the first data input from data at the second data input in response to a second signal state at the configuration input;

a code storage element coupled to the configuration input of the adder-subtractor; and a partial-result storage element having an input and an output, the input coupled to the adder-subtractor output, and the output coupled to the second data input of an adder-subtractor of another tap;

wherein the adder-subtractor of a first one of the taps has the second data input arranged to receive an input value 0.

6. A matched filter implemented on an FPGA, comprising:

n taps, each of tap numbers 0 through (n-2) including an adder-subtractor having an output, a configuration input, a first data input arranged to receive an input sample value, and a second data input, wherein the adder-subtractor performs addition of data at the first and second data inputs in response to a first signal state at the configuration input and subtraction of data at the first data input from data at the second data input in response to a second signal state at the configuration input;

a code storage element coupled to the configuration input of the adder-subtractor; and a plurality of partial-result storage elements coupled one to another in a chain, a first one of the partial-result storage elements coupled to the adder-subtractor output, and a last one of the partial-result storage elements coupled to the second data input of an adder-subtractor in another tap;

wherein the adder-subtractor of tap 0 has the second data input arranged to receive an input value 0; and tap number n-1 including an nth adder-subtractor having an output, a configuration input, a first data input arranged to receive the input sample value, and a second data input coupled to output of a last partial-result storage element of tap n-2, wherein the nth adder-subtractor performs addition of data at the first and second data inputs in response to a first signal state at the configuration input and subtraction of data at the first data input from data at the second data input in response to a second signal state at the configuration input;

an nth code storage element coupled to the configuration input of the nth adder-subtractor; and a final-result storage element coupled to output of the nth adder-subtractor.

7. The filter of claim 6, wherein one or more of the partial-results storage elements in each of the taps are implemented on function generators of an FPGA configured as shift registers.

8. The filter of claim 7, wherein each of the shift registers is configured with a shift size as a function of an over-sample rate.

9. The filter of claim 6, wherein each of the adder-subtractors is implemented as a parallel adder-subtractor.

10. The filter of claim 6, wherein each of the code storage elements includes storage for a plurality of codes, and further comprising a selection circuit coupled to outputs of the code storage elements and the configuration inputs of the adder-subtractors, the selection circuit arranged to select corresponding ones of the plurality of codes from the code storage elements.

11. The filter of claim 10, wherein each code storage element is comprised of a plurality of flip-flops, and the selection circuit includes a plurality of multiplexers implemented with function generators coupled to a respective code storage element.

12. The filter of claim 6, wherein each code storage element is implemented on a respective function generator of an FPGA configured as a shift register, and code bits are selectable from the code storage element via input address signals.

13. The filter of claim 12, further comprising:

a plurality of registers arranged for storage of respective channel input sample values;

a multiplexer coupled to the outputs of the plurality of registers, the multiplexer having an output coupled to the first data inputs of the adder-subtractors.

14. The filter of claim 6, further comprising:

a plurality of registers arranged for storage of respective channel input sample values;

a multiplexer coupled to the outputs of the plurality of registers, the multiplexer having an output coupled to the first data inputs of the adder-subtractors.

15. The filter of claim 6, wherein each code storage element is a dual-port RAM implemented with function generators of an FPGA.

16. A matched filter implemented on an FPGA for matching input sample values to a predetermined n-bit code sequence, comprising:

n taps, each tap associated with a respective bit of the code sequence and each of tap numbers 0 through (n-2) including a plurality of function generators configured as an m-bit arithmetic unit to perform addition if the associated bit of the code sequence is a first logic level and to perform subtraction if the associated bit of the code sequence is a second logic level, the arithmetic unit having an output, a first data input arranged to receive an input sample value, and a second data input; and a plurality of partial-result storage elements coupled one to another in a chain, a first one of the partial-result storage elements coupled to the arithmetic unit output, and a last one of the partial-result storage elements coupled to the second data input of an arithmetic unit in another tap;

wherein the arithmetic unit of tap 0 has the second data input arranged to receive an input value 0;

tap number n-i including a plurality of function generators configured as an m-bit arithmetic unit to perform addition if the associated bit of the code sequence is a first logic level and to perform subtraction if the associated bit of the code sequence is a second logic level, the arithmetic unit having an output, a first data input arranged to receive an input sample value, and a second data input coupled to output of a last partial-result storage element of tap n-2; and a final-result storage element coupled to output of the nth arithmetic unit.

17. The filter of claim 16, wherein one or more of the partial-results storage elements in each of the taps are implemented on function generators of an FPGA configured as shift registers.

18. The filter of claim 17, wherein each of the shift registers is configured with a shift size as a function of an over-sample rate.

19. A matched filter implemented on an FPGA for matching an n-bit code including bits 0 through (n-1), comprising:

i taps numbered tap 0 through tap (i-1), each tap including an adder-subtractor having an output, a configuration input, a first data input arranged to receive an input sample value, and a second data input, wherein the adder-subtractor performs addition of data at the first and second data inputs in response to a first signal state at the configuration input and subtraction of data at the first data input from data at the second data input in response to a second signal state at the configuration input;

a code storage element having an output coupled to the configuration input of the adder-subtractor and having storage for n/i bit values, wherein corresponding storage locations in the code storage elements are arranged for storage of bit numbers 0 through (i-1) of the n-bit code, corresponding storage locations in the code storage elements are arranged for storage of bits i through (2i-1) of the n-bit code, corresponding storage locations in the code storage elements are arranged for storage of bits 2i through (3i-1) of the n-bit code, . . . , and corresponding storage locations in the code storage elements are arranged for storage of bits (i-1)i through (n-1), each code storage element providing an output bit value responsive to code selection signals; and n partial-result storage elements coupled one to another in a chain, a first one of the partial-result storage elements coupled to the adder-subtractor output, and a last one of the partial-result storage elements coupled to the second data input of an adder-subtractor in another tap; and a holding register coupled between output of the last partial-result storage element in tap (i-1) and the adder-subtractor of tap 0.

20. The filter of claim 19, wherein one or more of the partial-results storage elements in each of the taps are implemented on function generators of an FPGA configured as shift registers.

21. The filter of claim 19, wherein each code storage element is a dual-port RAM implemented with function generators of an FPGA.

22. The filter of claim 19, wherein each code storage element is implemented on a respective function generator of an FPGA configured as a shift register, and code bits are selectable from the code storage element via input address signals.

* * * * *